United States Patent [19]

Limper-Brenner et al.

[11] Patent Number: 5,731,542
[45] Date of Patent: Mar. 24, 1998

[54] APPARATUS AND METHOD FOR MOUNTING AN ELECTRONIC COMPONENT TO A SUBSTRATE AND METHOD FOR SPRAY-COOLING AN ELECTRONIC COMPONENT MOUNTED TO A SUBSTRATE

[75] Inventors: Linda Limper-Brenner, Glenview; Detlef W. Schmidt, Schaumburg; Kevin J. McDunn, Lake in the Hills; Minoo D. Press, Schaumburg, all of Ill.

[73] Assignee: Motorola, Inc., Schaumburg, Ill.

[21] Appl. No.: 652,205

[22] Filed: May 23, 1996

[51] Int. Cl.$^6$ ................................................ H01L 23/02
[52] U.S. Cl. ...................... 174/52.4; 257/704; 257/730
[58] Field of Search ............................. 257/704, 680, 257/730, 729, 731, 732; 174/52.1, 52.4

[56] References Cited

U.S. PATENT DOCUMENTS

| | | | |
|---|---|---|---|
| 3,725,566 | 4/1973 | Plizak | 174/15 R |
| 4,399,484 | 8/1983 | Mayer | 361/382 |
| 4,542,076 | 9/1985 | Bednarz et al. | 428/624 |
| 4,706,164 | 11/1987 | L'Henaff et al. | 361/382 |
| 4,711,431 | 12/1987 | Viannay et al. | 266/114 |
| 4,847,731 | 7/1989 | Smolley | 361/385 |
| 4,854,377 | 8/1989 | Komoto et al. | 165/80.4 |
| 4,884,167 | 11/1989 | Mine | 165/80.4 |
| 4,935,864 | 6/1990 | Schmidt et al. | 361/141 |
| 4,945,980 | 8/1990 | Umezawa | 165/101 |
| 4,964,019 | 10/1990 | Belanger, Jr. | 361/401 |
| 5,014,777 | 5/1991 | Sano | 165/185 |
| 5,050,037 | 9/1991 | Yamamoto et al. | 361/385 |
| 5,057,968 | 10/1991 | Morrison | 361/385 |
| 5,131,233 | 7/1992 | Cray et al. | 62/64 |
| 5,166,863 | 11/1992 | Shmunis | 361/385 |

(List continued on next page.)

OTHER PUBLICATIONS

M. Ghodbane et al., "Experimental Study of Spray Cooling with Freon–113", Int. J. Heat Mass Transfer, vol. 34, No. 4/5, pp. 1163–1174 (1991).

J.P. Holman et al., "Extended Studies of Spray Cooling with Freon–113", Int. J. Heat Mass Transfer, vol. 36, No. 8, pp. 2239–2241 (1992).

Donald E. Tilton et al., "High-Flux Spray Cooling in a Simulated Multichip Module", HTD—vol. 206-2, Topics in Heat Transfer—vol. 2, ASME (1992).

S.K. Chen et al., "Factors Influencing the Effective Spray Cone Angle of Pressure–Swirl Atomizers", Journal of Engineering for Gas Turbines and Power, vol. 114, pp. 97–103 (Jan. 1992).

Donald Tilton et al., "Advanced Thermal Management for Multichip Modules", Electronic Packaging and Production, pp. 71–73 (Aug. 1995).

Kurt A. Estes et al., "Comparison of Two–Phase Electronic Cooling Using Free Jets and Sprays", Journal of Electronic Packaging, vol. 117, pp. 323–332 (Dec. 1995).

Kurt A. Estes et al., "Correlation of Sauter Mean Diameter and Critical Heat Flux for Spray Cooling of Small Surfaces", Int. J. Heat Mass Transfer, vol. 38, No. 16, pp. 2985–2996 (1995).

*Primary Examiner*—Kristine L. Kincaid
*Assistant Examiner*—Hung V. Ngo
*Attorney, Agent, or Firm*—Heather L. Creps

[57] ABSTRACT

The electronic component (10) has a die (22) and a terminal (14) coupled to the die (22). The substrate has a first side (20) and a second side (82) and a passage (26) therethrough. The terminal (14) is in communication with the first side (20) and the die (22) is disposed within the passage (26). The apparatus includes a cover (16) which encloses the die (22) and a portion of the terminal (14), and has a fixed portion (28) and a removable portion. The fixed portion (28) includes a connection region coupled to the terminal (14) and an extension region disposed within the passage (26). The extension region has a surface that is substantially coplanar with the second side (82). There is a space (32) between the extension region and the substrate (18). An adhesive (34) is disposed on the surface of the extension region, extending into the space (32). A sealing frame (36) overlaps the space (32) and is in communication with the adhesive (34) and the second side (82).

12 Claims, 3 Drawing Sheets

U.S. PATENT DOCUMENTS

| | | | |
|---|---|---|---|
| 5,174,364 | 12/1992 | Mizuno | 165/13 |
| 5,175,395 | 12/1992 | Moore | 174/35 R |
| 5,177,666 | 1/1993 | Bland et al. | 361/382 |
| 5,190,099 | 3/1993 | Mon | 165/104.33 |
| 5,210,440 | 5/1993 | Long | 257/675 |
| 5,220,804 | 6/1993 | Tilton et al. | 62/64 |
| 5,232,164 | 8/1993 | Resch et al. | 239/434 |
| 5,256,833 | 10/1993 | Schwenk | 174/35 R |
| 5,264,984 | 11/1993 | Akamatsu | 361/689 |
| 5,285,351 | 2/1994 | Ikeda | 361/699 |
| 5,289,363 | 2/1994 | Ferchau et al. | 363/141 |
| 5,329,419 | 7/1994 | Umezawa | 361/699 |
| 5,348,076 | 9/1994 | Asakawa | 165/13 |
| 5,360,993 | 11/1994 | Mine | 257/714 |
| 5,371,408 | 12/1994 | Moulton et al. | 257/730 |
| 5,384,687 | 1/1995 | Sano | 361/689 |
| 5,388,030 | 2/1995 | Gasser et al. | 361/818 |
| 5,431,974 | 7/1995 | Pierce | 428/45 |
| 5,436,501 | 7/1995 | Ikeda | 257/714 |
| 5,436,793 | 7/1995 | Sanwo et al. | 361/689 |
| 5,463,528 | 10/1995 | Umezawa | 361/699 |
| 5,477,081 | 12/1995 | Nagayoshi | 257/678 |
| 5,483,423 | 1/1996 | Lewis et al. | 361/816 |
| 5,491,363 | 2/1996 | Yoshikawa | 257/715 |

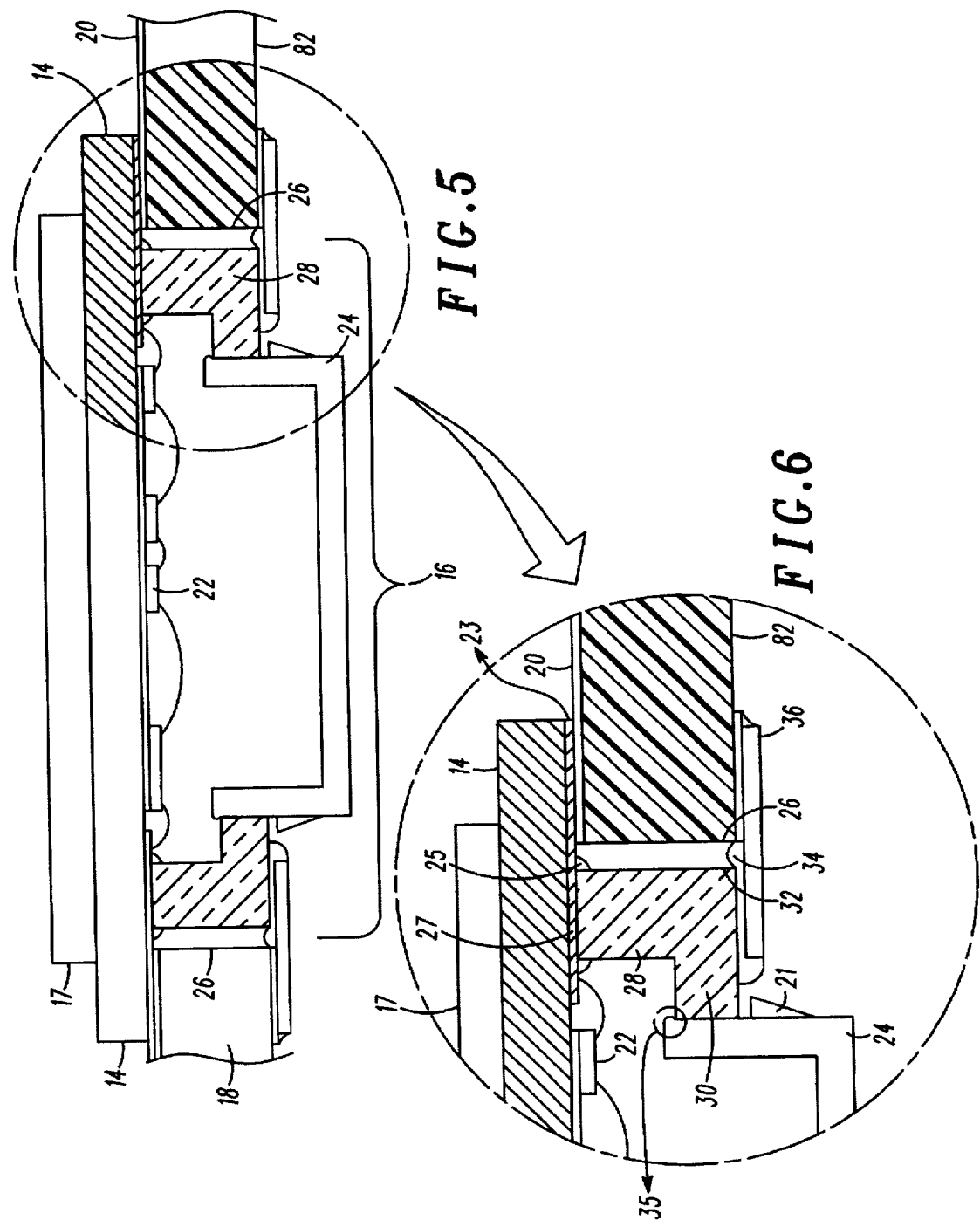

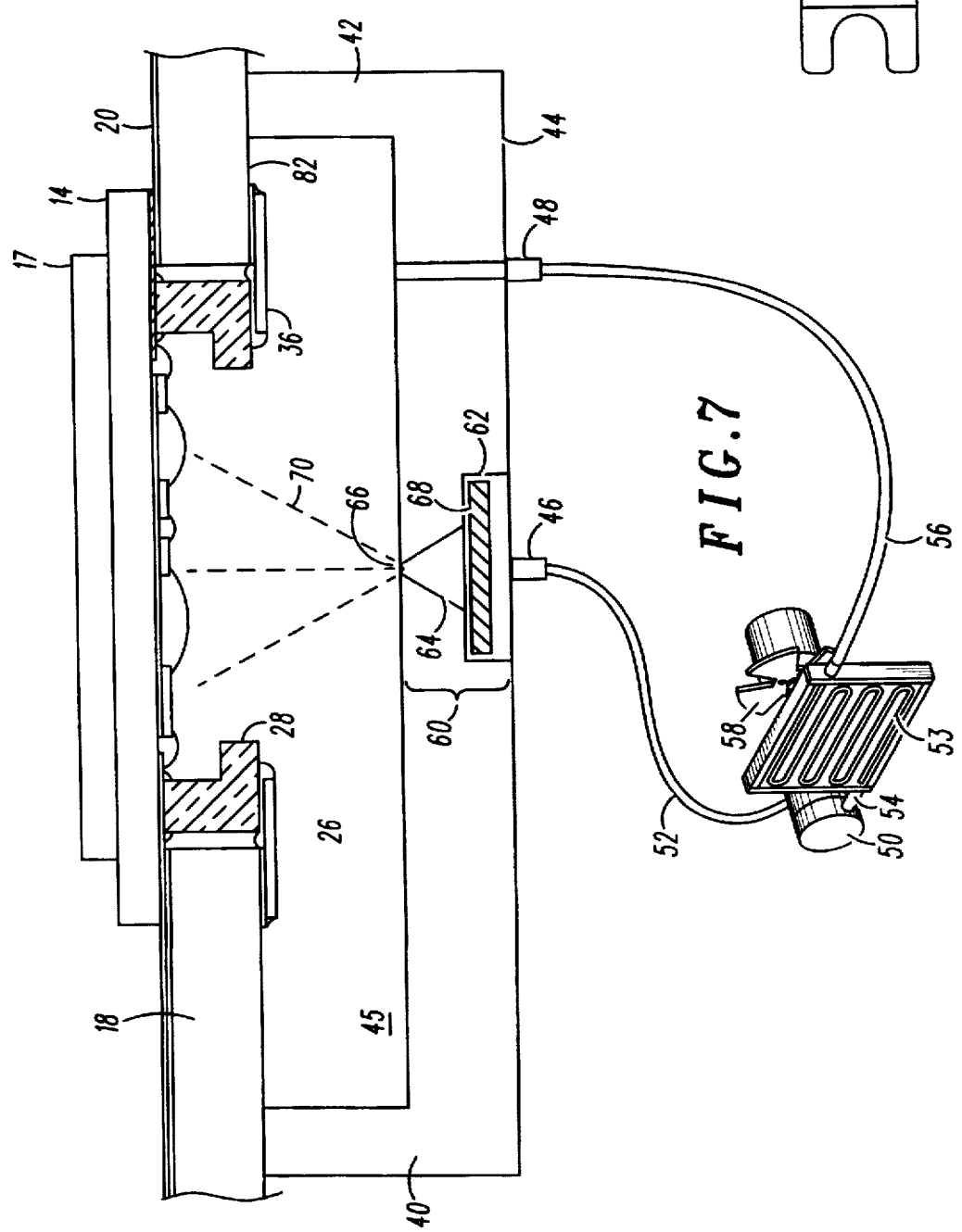

APPARATUS AND METHOD FOR MOUNTING AN ELECTRONIC COMPONENT TO A SUBSTRATE AND METHOD FOR SPRAY-COOLING AN ELECTRONIC COMPONENT MOUNTED TO A SUBSTRATE

FIELD OF THE INVENTION

This invention relates generally to electronic components, and, more particularly, to an apparatus and method for mounting an electronic component to a substrate and to a method for spray-cooling an electronic component mounted to a substrate.

BACKGROUND OF THE INVENTION

Electronic modules such as printed circuit boards (PCBs), multi-chip modules (MCMs) and electronic hybrid assemblies are generally comprised of a number of individual electronic components such as integrated circuits, passive components and power transistors, mounted to a common substrate. The individual electronic components may be heat sources which require cooling during normal operation as well as during testing and tuning.

Often, electronic components are cooled by natural or forced air convection which, because of the relatively poor thermal capacitance and heat transfer coefficients of air, requires moving large volumes of air past the components or past heavy heat sinks attached to the components. The air cooling process, however, may not provide uniform cooling for each heat-producing electronic component within an electronic module, and may introduce undesired acoustic noise or contaminants, such as dust, onto the components.

Evaporative spray cooling features the spraying of atomized fluid droplets directly or indirectly onto a surface of a heat source such as an electronic component. When the fluid droplets impinge upon the component's surface, a thin film of liquid coats the component, and heat is removed primarily by evaporation of the fluid from the component's surface.

Although evaporative spray cooling is a preferred method of heat removal in many electronics applications, known spray cooling systems are generally designed to cool entire surfaces of large electronic modules. Because fluid is typically sprayed directly onto the surface of electronic modules, the fluid may capture particulate matter from the electronic components, such as flux residue, which can clog nozzles and impede the effective spraying of the fluid. In addition, heat-producing electronic components may be isolated in areas of electronic modules which have otherwise low heat-loads, so that spray-cooling an entire electronic module may not be desirable or practical.

Furthermore, extensive sealing may be required prior to operation of the spray-cooling system, so that operation of the cooling system during the testing and tuning process of the modules, which often requires unimpeded access to the components, may be impractical.

There is therefore a need for an apparatus and method for mounting an electronic component to a substrate which would facilitate the spray-cooling of the electronic component during the testing and tuning process, which would allow high heat-producing components to be located on the same side of an electronic module as all other components while being cooled from the opposite side of the electronic module, and which would reduce the problem of contamination.

SUMMARY OF THE INVENTION

According to an aspect of the present invention, the foregoing needs are addressed by an apparatus for mounting an electronic component to a substrate. The electronic component has a die and a terminal coupled to the die. The substrate has a first side and a second side and has a passage therethrough. The terminal is in communication with the first side and the die is disposed within the passage. The apparatus includes a cover, the cover enclosing the die and at least a portion of the terminal. The cover has a fixed portion and a removable portion detachably connected to the fixed portion. The fixed portion includes a connection region and an extension region. The connection region is coupled to the terminal and the extension region is disposed within the passage. The extension region has a surface that is substantially coplanar with the second side. There is a space between the extension region and the substrate. An adhesive is disposed on the surface of the extension region, and at least a portion of the adhesive extends into the space. A sealing frame overlaps the space and is in communication with the adhesive and the second side.

According to another aspect of the present invention, a method for mounting an electronic component to a substrate, the electronic component having a die and the substrate having a first side and a second side, includes providing a passage through the substrate; locating a cover within the passage, the cover enclosing at least a portion of the die, the cover having a fixed portion and a removable portion, the removable portion detachably connected to the fixed portion, the fixed portion having a first end and a second end, the first end coupled to the first side, the second end having a surface that is substantially coplanar with the second side; supplying an adhesive to the surface; and providing a sealing frame in communication with the adhesive and the second side.

According to a further aspect of the present invention, a method for spray-cooling an electronic component mounted to a substrate, the electronic component having a die and the substrate having a first side and a second side, includes providing a passage through the substrate; locating a wall within the passage, the wall surrounding the die and having a base surface and a top surface, the base surface coupled to the first side, the top surface substantially planar to the second side; supplying an adhesive in communication with the top surface; providing a sealing frame in communication with the adhesive and the second side; and coupling a housing defining a chamber to the second side, the housing enclosing the sealing frame.

Advantages of the present invention will become readily apparent to those skilled in the art from the following description of the preferred embodiment(s) of the invention which have been shown and described by way of illustration. As will be realized, the invention is capable of other and different embodiments, and its details are capable of modifications in various respects. Accordingly, the drawings and description are to be regarded as illustrative in nature, and not as restrictive.

BRIEF DESCRIPTION OF THE DRAWINGS

FIG. 5 is a front view of the electronic component depicted in FIGS. 2 and 4, mounted to a substrate in accordance with a preferred embodiment of the present invention.

FIG. 6 is an enlarged view of a portion of the electronic component of FIG. 5.

FIG. 7 is a front view of the electronic component mounted as shown in FIGS. 5 and 6, further depicting a spray-cooling system having a closed-loop fluid flow according to a preferred embodiment of the present invention.

FIG. 8 is a bottom view of an alternative flange design for the electronic component shown in FIGS. 1 and 3, for use with a spray-cooling system having a closed-loop fluid flow, such as the system shown in FIG. 7.

DETAILED DESCRIPTION OF THE PREFERRED EMBODIMENTS

Figure 1:
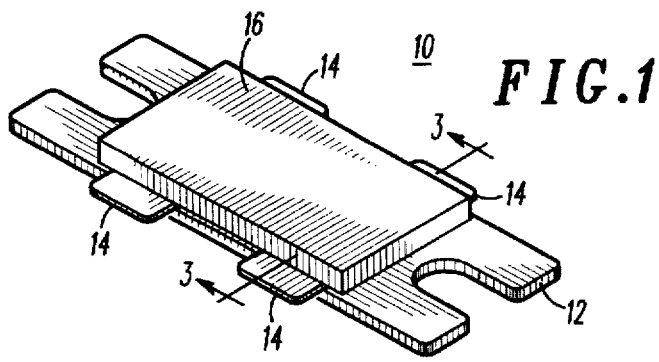
FIG. 1 is a perspective view of a typical electronic component.

Turning now to the drawings, wherein like numerals designate like components, FIG. 1 is a perspective view of a typical electronic component 10, which includes a device pedestal 12, or flange; a number of terminals 14; a cover 16 and one or more dies (not shown), which are protected by cover 16.

Electronic component 10 may be, for example, an NPN Silicon Radio Frequency (RF) Power Transistor, available from Motorola, order number MRF899/D. References to electronic component 10 will be understood to apply not only to component 10 as depicted in FIG. 1, but also to differently-configured power transistors such as a flangeless RF power transistor, available from Motorola, order number SRF7016, illustrated in FIG. 2.

Figure 2:
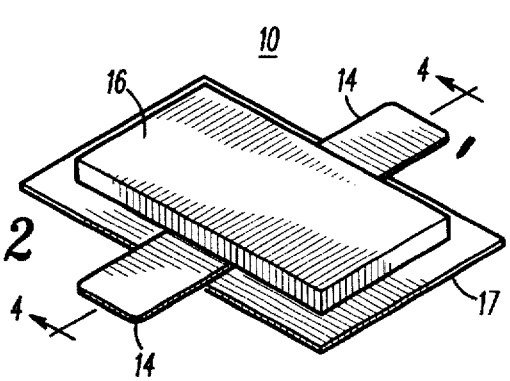
FIG. 2 is a perspective view of another typical electronic component.

As shown in FIG. 2, electronic component 10 includes terminals 14; cover 16; a base 17 such as alumina, which has a slight thickness and which extends slightly from cover 16; and one or more dies (not shown), which may be, for example, a transistor base, an transistor emitter and a transistor collector. Dies 22 are enclosed by cover 16. Component 10 depicted in FIG. 2, unlike component 10 depicted in FIG. 1, does not include flange 12.

Figure 3:
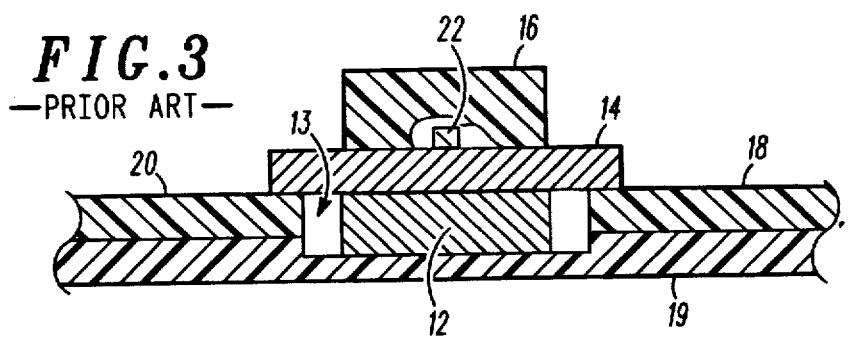
FIG. 3 is a front view along line 3—3 of the electronic component depicted in FIG. 1, illustrating a typical manner mounting the component to a substrate.

FIG. 3 is a front view along line 3—3 of electronic component 10 depicted in FIG. 1, illustrating a typical manner of mounting component 10 to a substrate 18 using a carrier plate 19. Substrate 18 comprises one or more layers of glass-filled epoxy, teflon, alumina, ceramic or plastic. Carrier plate 19 is made, for example, of copper, aluminum-silicon carbide (AlSiC) or graphite.

As shown, terminals 14 are in communication with a first side 20 of substrate 18. Terminals 14 may be attached to substrate 18 or to another device (not shown) located on substrate 18 in a variety of ways, such as soldering or conductive epoxy. Cover 16, which encloses at least one heat-generating die 22, is coupled to terminals 14 and is positioned on first side 20 of substrate 18. Flange 12, which may provide an electrical grounding surface and enhanced heat spreading for die 22, may be secured to carrier plate 19 in a variety of ways, using screws, for example. Die 22, therefore, is typically surrounded by cover 16 on one side and by flange 12 on the other.

Figure 4:
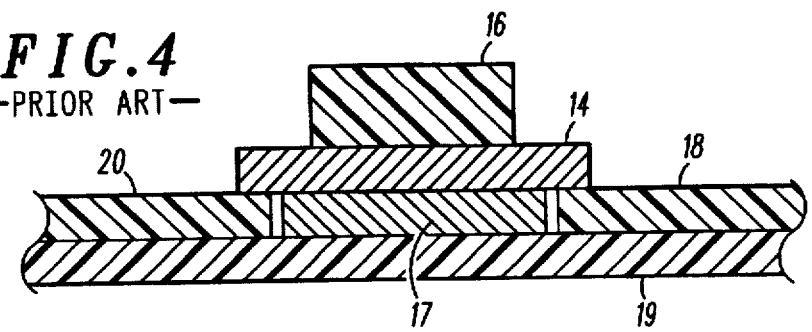
FIG. 4 is a front view along line 4—4 of the electronic component depicted in FIG. 2, illustrating a typical manner of mounting the component to a substrate.

Referring to FIG. 4, electronic component 10, illustrated in FIG. 2, is mounted to carrier plate 19 and substrate 18 in a typical manner. Base 17 of component 10 extends at least in part into substrate 18. Terminals 14 are in communication with first side 20 of substrate 18. Terminals 14 may be attached to substrate 18 or to a device (shown in FIG. 3) located on substrate 18 in a variety of ways, such as soldering or conductive epoxy. Cover 16, which protects at least one heat-generating die 22 (not shown), is coupled to terminals 14 and is located on first side 20 of substrate 18.

FIGS. 5 and 6 are front views of electronic component 10 as depicted in FIGS. 2 and 4, rotated 180 degrees relative to the plane of substrate 18, in accordance with a preferred embodiment of the present invention. Thus, component 10 is reverse-mounted with respect to the traditional mounting technique. A passage 26 extends through substrate 18 and carrier plate 19, if present (carrier plate 19 is not shown in FIGS. 5 and 6, and for simplicity, both substrate 18 and the combination of substrate 18 and carrier plate 19 will be referred to hereafter as simply substrate 18), from first side 20 to a second side 82 of substrate 18. passage 26 may be cylindrical, rectangular or of another suitable shape. Cover 16, which preferably includes a fixed portion 28, such as a wall, and a removable portion 24, encloses die 22 and a least a portion of terminals 14. Fixed portion 28 is preferably ceramic, but may be another suitable material such as high-temperature plastic or liquid-crystal polymer. Removable portion 24 is preferably plastic, but likewise may be made of another material, such as ceramic or metal fill. Removable portion 24 is detachably connected to fixed portion 28, and may, for example, snap onto fixed portion 28 via flange 21 and bump 35, or may be secured with an adhesive (not shown), and then be peeled off.

Fixed portion 28 is preferably secured to terminal 14 at a connection region 27 using an epoxy 25, such as a B-staged epoxy. A one-piece cover having a pre-applied B-staged epoxy, which may be modified for use as herein described, is available from RJR polymer, order number B15523C010. Terminal 14 may be soldered or otherwise secured to first side 20 of substrate 18, via a metallization region 23 on terminal 14, for example. An extension region 30 of fixed portion 28 has a surface which is substantially coplanar with second side 82 of substrate 18, the extension region 28 and substrate 18 having a space 32 therebetween, so that passage 26 is not completely filled.

An adhesive material 34, for example, a polyamid hot-melt material, such materials being well-known and widely available, is disposed on the surface of extension region 28, a portion of adhesive 34 preferably extending into space 32. A sealing frame 36, which is connected to second side 82 of substrate 18 and overlaps space 32, is also in contact with adhesive 34. Sealing frame 36 is preferably a metallic frame such as brass which surrounds passage 26, covering space 32. Sealing frame 36 may be soldered to second side 82 using high-temperature solder, but may also be ultrasonically welded or laser-welded to second side 82, or attached using an adhesive such as silicone or another high-temperature adhesive.

According to one possible method of assembling component 10 to substrate 18 so that component 10 is reverse-mounted with respect to the traditional mounting technique, solder paste may be applied to first side 20 of substrate 18 in the area of terminals 14 using a well-known method such as screen-printing. Then, component 10, including adhesive 34 which may be pre-formed in the shape of a gasket and disposed on the surface of extension region 28, may be placed cover-side down within passage 26, so that adhesive 34 contacts sealing frame 36. Next, the entire assembly may be heated using a standard temperature reflow profile. When the solder paste melts, terminals 14 are electrically joined. When adhesive 34 melts, a hermetic seal is formed between fixed portion 28 of cover 16 and second side 82 of substrate 18. To ensure that removable portion 24 of cover 16 remains detachable, removable portion 24 may be treated with a mold-release material (not shown), such materials being well-known and widely available, prior to the reflow process.

FIG. 7 is a side-view of electronic component 10 mounted as shown in FIGS. 5 and 6, removable portion 24 of cover 16 having been removed, which further depicts a spray-cooling system having a closed-loop fluid flow according to a preferred embodiment of the present invention. A housing 40 having a side surface 42 and a top surface 44 and defining a chamber 45 is coupled to second side 82 of substrate 18. Housing 40 is preferably rectangular, but may be another geometrical shape, such as cylindrical, and is preferably plastic, but may be constructed from another suitable material such as metal. Housing 40 may also include an electromagnetic interference-attenuating material (not shown).

One or more nozzles 60 are preferably disposed in top surface 44 of housing 40. A single nozzle 60 is shown. Nozzle 60 has a receptacle end 62, which is in communication with a fluid inlet port 46; a spray end 64, which includes an aperture 66, preferably on the order of 0.15 mm in diameter; and a swirl plate or insert 68. Swirl plate 68 may be secured to receptacle end 62 by, for example, press-fitting, soldering or bonding. It will be appreciated, however, that nozzle 60, along with swirl plate 68, may be integrally formed in housing 40.

Nozzle 60 is preferably a miniature atomizer such as a simplex pressure-swirl atomizer, which is approximately 1.5 mm high, and may be made of any suitable material. An example of a suitable material is a metal such as brass or stainless steel. Simplex pressure-swirl atomizers are described in detail in U.S. Pat. No. 5,220,804 to Tilton et al., incorporated herein by reference, and are commercially available from Isothermal Systems Research, Inc., located in Colton, Washington.

A fluid pump 50, which is connected via tube 52 to fluid inlet port 46, supplies a coolant fluid to receptacle end 62 of nozzle 60, which has been fitted with swirl plate 68. Spray end 64 atomizes the coolant and discharges an atomized fluid 70 through aperture 66 into chamber 45 and onto one or more dies 22. Fluid 45 may be discharged from aperture 66 at an angle to top surface 44, preferably at a substantially perpendicular angle to top surface 44. When atomized fluid 45 impinges upon the surfaces of dies 22, a thin liquid film coats dies 22, and heat is removed primarily by evaporation of fluid 45 from dies 22. Excess fluid is collected and removed from housing 40 via fluid outlet port 48.

The coolant fluid may be any dielectric coolant, such coolants being well-known and widely available. One example of a suitable coolant is 3M's Fluorinert™ dielectric fluid, available from 3M, order number FC-72. Another perfluorocarbon fluid similar to 3M's Fluorinert™ dielectric fluid is available from Ausimont Galden®.

A condenser 53, connected to pump 50 by tube 54 and to fluid outlet port 48 by tube 56, receives fluid from fluid outlet port 48. Condenser 53 rejects heat from the fluid, returning it to primarily a liquid phase. Fan 58 may be used to extend the cooling capacity of condenser 53. Cooled fluid is supplied from condenser 53 to pump 50. Thus, a closed-loop flow of coolant is formed. It will be appreciated that at any given point the coolant may be a vapor, a liquid or a vapor and liquid mixture.

It is contemplated that any conventional means for providing flow of a coolant may be used in conjunction with the described embodiments of the present invention, and that more than one housing 40 may be connected to a single source of coolant or that one or more sources of coolant may be connected to a single housing 40, for example, for redundancy purposes.

Sizes of fluid pump 50, condenser 53 and fan 58 should be selected based on heat removal and flow rate requirements. For example, a typical closed-loop fluid flow is 500 to 1000 milliliters per minute for 500 to 1000 Watts of heat dissipation. Pump and condenser assemblies in various sizes are available from Isothermal Systems Research, Inc., and acceptable tubing and fittings may be obtained from Cole-Parmer in Vernon Hills, Ill.

An electronic component or a group of electronic components having a power density of up to 300 Watts per square centimeter is effectively cooled using the disclosed apparatus. The removal of heat directly from individual reverse-mounted electronic components, or from groups of reverse-mounted electronic components, rather than from an entire electronic module, helps to reduce operating temperatures of the components, increasing reliability through reduction of thermal variation and associated thermal stresses.

Housing 40 may be placed extremely close to the surface of an electronic module because reverse-mounted components do not extend past the substrate, and because spacing is not governed by air volume requirements. Thus, packaging size for the electronic module may be reduced. In addition, unlike air cooling, which is most effective when heat is spread over a large area, for example, over a large heat sink, spray-cooling encourages heat concentration, another factor contributing to reduced packaging volume and weight.

The reverse-mounting of spray-cooled electronic components substantially reduces the chance that contaminants from other, non-reverse-mounted, components will be captured by the cooling fluid and clog fluid-atomizing nozzles. And soldering flux associated with the reverse-mounted components is generally located on the opposite side of the electronic component from the fluid, further reducing the potential for contamination.

Selectively reverse-mounting electronic components, which may be isolated spots of high heat-load in otherwise low heat-load areas of an electronic module, may help to reduce surface area on a crowded electronic module that is devoted to mounting a spray-cooling system. Thus, electronic module sizes should not increase because of the spray-cooling system.

The mounting apparatus and method described herein results in a hermetically sealed electronic component, and housing 40 is easily installed and removed. Thus, embodiments of the present invention are desirable for cooling an electronic component during the testing and tuning process. For example, an electronic module may be designed which has one side devoted to test fixtures and to electronic devices that do not require spray-cooling, and another side devoted to high heat-dissipating, reverse-mounted electronic components. Then, the electronic module may be tested and spray-cooled simultaneously. But because both traditionally-mounted and reverse-mounted components are mounted from the same side of the electronic component, the ease of assembly of the electronic module may be maintained.

The closed-loop fluid flow system described herein also has many advantages. For example, the system provides for unobstructed access to individual electronic components, further facilitating inspection, testing and repair of both the spray-cooling system and the electronic components.

It should be appreciated that the present invention is not limited to cooling a reverse-mounted electronic component, but may be adapted to cool any heat source, for example, a heat sink or flange which is mounted to a substrate in a traditional fashion, as depicted in FIG. 3. Referring to FIG. 3, cut-away portion 13 may be extended completely through substrate 18 and carrier plate 19 at predetermined points, or holes may be formed within carrier plate 19 so that flange 12 is exposed. Then, a spray-cooling system having a closed-loop fluid flow, such as the system depicted in FIG. 7, may be coupled to carrier plate 19 and used to spray-cool flange 12.

FIG. 8 illustrates a bottom view of an alternative design for flange 12, which would further facilitate heat removal from die 22. As shown, flange 12 includes one or more holes 80, so that coolant fluid may impinge directly on die 22 and/or terminals 14. It is contemplated that flange 12 may be used with an electronic component which has been mounted in the traditional fashion or which has been reverse-mounted as described herein.

It is further contemplated that wherever sealing and/or fastening may be required, numerous methods and materials may be used. For example, fasteners such as screws, compliant gaskets, ultrasonic welding, brazing, soldering or swaging may be utilized.

It will be apparent that other and further forms of the invention may be devised without departing from the spirit and scope of the appended claims and their equivalents, and it will be understood that this invention is not to be limited in any manner to the specific embodiments described above, but will only be governed by the following claims and their equivalents.

We claim:

1. An apparatus for mounting an electronic component to a substrate, the electronic component having a die and a terminal coupled to the die, the substrate having a first side and a second side and having a passage therethrough, the terminal in communication with the first side and the die disposed within the passage, the apparatus comprising:

a cover, the cover enclosing the die and at least a portion of the terminal, the cover having a fixed portion and a removable portion detachably connected to the fixed portion, the fixed portion comprising a connection region and an extension region, the connection region coupled to the terminal, the extension region disposed within the passage and having a surface that is substantially coplanar with the second side, the extension region and the substrate having a space therebetween;

an adhesive disposed on the surface of the extension region, at least a portion of the adhesive extending into the space; and a sealing frame in communication with the adhesive and the second side, the sealing frame overlapping the space.

2. The apparatus according to claim 1, wherein the electronic component is one of a power transistor and an integrated circuit.

3. The apparatus according to claim 1, wherein the substrate is one of a printed circuit board and an alumina substrate.

4. The apparatus according to claim 1, wherein the fixed portion comprises ceramic.

5. The apparatus according to claim 1, wherein the removable portion comprises plastic.

6. The apparatus according to claim 1, wherein the removable portion snaps into the fixed portion.

7. The apparatus according to claim 1, wherein the terminal is soldered to the first side.

8. The apparatus according to claim 1, further comprising an epoxy material, the epoxy material coupling the connection region to the terminal.

9. The apparatus according to claim 1, wherein the adhesive comprises a polyamid material.

10. The apparatus according to claim 9, wherein the polyamid material comprises a hot-melt preform.

11. The apparatus according to claim 1, wherein the sealing frame comprises brass.

12. The apparatus according to claim 1, further comprising:

a flange coupled to the terminal, the flange having a plurality of holes therethrough.

* * * * *